(12) United States Patent
Cukur

(10) Patent No.: US 7,518,364 B1
(45) Date of Patent: Apr. 14, 2009

(54) SPECIES SEPARATION USING SELECTIVE SPECTRAL SUPRESSION IN BALANCED STEADY-STATE FREE PRECESSION IMAGING

(75) Inventor: Tolga Cukur, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/016,839

(22) Filed: Jan. 18, 2008

(51) Int. Cl.
*G01V 3/00* (2006.01)
(52) U.S. Cl. ........................... 324/309; 324/307
(58) Field of Classification Search ......... 324/300–322; 600/407–445
See application file for complete search history.

(56) References Cited

U.S. PATENT DOCUMENTS

| | | | |
|---|---|---|---|
| 6,307,368 B1 | 10/2001 | Vasanawala et al. | |
| 6,608,479 B1 | 8/2003 | Dixon et al. | |
| 7,046,003 B2 * | 5/2006 | Hargreaves et al. | 324/307 |
| 7,332,908 B2 * | 2/2008 | Nayak et al. | 324/307 |
| 7,449,884 B1 * | 11/2008 | Cukur et al. | 324/307 |
| 2008/0012566 A1 * | 1/2008 | Pineda et al. | 324/309 |

OTHER PUBLICATIONS

Tolga Cukur, Dwight G. Nishimura, "Fat-Water Separation in Alternating Repetition Time Balanced SSFP", Poster was presented at the ISMRM 15th Scientific Meeting and Exhibition, Berlin, May 19-25, 2007.
Tolga Cukur, Dwight G. Nishimura, "Fat-Water Separation in Alternating Repetition Time (ATR) Balanced SSFP", Abstract was presented at the ISMRM 15th Scientific Meeting and Exhibition, Berlin, May 19-25, 2007.
Tolga Cukur, Dwight G. Nishimura, "Fat-Water separation with Alternating Repetition Time Balanced SSFP", Submitted to Magnetic Resonance in Medicine on Jul. 15, 2007 (Revised submission as a note on Mar. 18, 2008), not yet published.

* cited by examiner

*Primary Examiner*—Brij B Shrivastav
(74) *Attorney, Agent, or Firm*—Beyer Law Group LLP

(57) ABSTRACT

A method of providing selective spectral suppression in balanced steady-state free procession (SSFP) magnetic resonance imaging for a first species and a second species is provided. A plurality of balanced SSFP images are acquired, wherein each acquisition of a balanced SSFP image comprises applying an alternating TR RF excitation, wherein the alternating TR RF excitation has a first TR and a second TR, wherein a period of the first TR (TR1) is greater than a period of the second TR (TR2), applying balanced magnetic gradients, acquiring an in-phase acquisition of the first and second species, acquiring an out-of-phase acquisition of the first and second species, and combining the in-phase acquisition and the out-of-phase acquisition to produce a combined image.

18 Claims, 10 Drawing Sheets

SPECIES SEPARATION USING SELECTIVE SPECTRAL SUPRESSION IN BALANCED STEADY-STATE FREE PRECESSION IMAGING

GOVERNMENT RIGHTS

The U.S. government has rights in the disclosed invention pursuant to National Institutes of Health (NIH) grants to Stanford University including R01 HL039297, and R01 HL075803.

BACKGROUND OF THE INVENTION

This invention relates generally to magnetic resonance imaging (MRI), and more particularly the invention relates to MRI using steady-state free precession (SSFP) with selective spectral suppression.

Magnetic resonance imaging (MRI) is a non-destructive method for the analysis of materials and represents a new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

MRI is based on nuclear spins, which can be viewed as vectors in a three-dimensional space. During a MRI process, each nuclear spin responds to four different effects—precession about the main magnetic field, mutation about an axis perpendicular to the main field, and both transverse and longitudinal relaxation. In steady-state MRI processes, a combination of these effects occurs periodically.

Fully-reinforced steady-state free precession (SSFP) imaging (also known as balanced SSFP, FIESTA, TreuFISP), provides high signal-to-noise ratio (SNR) efficiency. However, the T2/T1 dependence of the SSFP signal causes fat tissue to appear bright in the reconstructed images. The tissues of interest usually have a comparable or smaller balanced SSFP signal. Therefore, fat-water separation or fat suppression methods have commonly been coupled with SSFP imaging to improve depiction of the structure of interest.

A number of interesting strategies have been devised for reducing or suppressing the fat signal. A simple and effective strategy is to use periodically repeated spectral saturation during the course of acquisition (fat-saturated SSFP); however, transient signal oscillators due to the disruption of the steady-state may lead to artifacts. Another fat-suppression method exploiting the transient signal is fat-saturated TIDE. It is difficult to do 3D imaging and images can be blurred due to overweighting of the central part of k-space. The phase difference due to the chemical-shift between fat and water can be used to separate the two components. Phase-sensitive SSFP is a fast and efficient method requiring only a single acquisition; however, it suffers from partial volume effects. Several other useful multiple-acquisition Dixon-based methods have been proposed for fat-water separation. For these techniques, partial volume effects lead to estimation errors.

A variety of SSFP fat suppression methods reduce the fat signal by creating a stop-band around the fat-resonance. Several proposed spectrally selective fat-suppression methods include fluctuating equilibrium magnetic resonance (FEMR), linear combination SSFP (LCSSFP), periodic flip angle variations and binomial excitation patterns to suppress fat, in- and out-of-phase SSFP imaging and fat suppression alternating repetition time (FS-ATR) SSFT have bene tried. High RF linearity is required for methods varying the flip angle or comprising binomial excitation for suppressing fat.

LCSSFP uses two separate phase-cycled acquisitions and combines them to yield a spectral stop-band around the fat-resonance. The width of the stop-band and the separation between the pass- and the stop-band is determined by the repetition time (TR). On the other hand, FS-ATR uses two different repetition times consecutively played, to create a broad stop-band by aligning the spins precessing at the fat-resonance back to the longitudinal axis. FEMR and LCSSFP put stringent limitations on the possible repetition times, whereas FS-ATR allows for a broader range of repetition times (TR).

A drawback of multiple-acquisition spectrally selective methods, like LCSSFP, is the wedge-shape of the stop-band. The two profiles subtracted from each other are not identical and the SSFP profile is inhomogeneous itself. Imperfect cancellation of SSFP profiles pertaining to different acquisition results in remnant stop-band signal. Therefore, the level of fat-suppression is limited by moderate off-resonant frequency variations.

U.S. Pat. No. 6,307,368 by Vasanwala et al., issued Oct. 23, 2001, entitled "Linear Combination Steady-State Free Precession MRI," which is incorporated by reference for all purposes describes a steady-state free precession MRI process. U.S. Pat. No. 6,608,479 by Dixon et al., issued Aug. 19, 2003, entitled, "Method and System for MRI with Lipid Suppression," which is incorporated by reference for all purposes describes another stead-state free precession process.

SUMMARY OF THE INVENTION

In accordance with the invention, a method of providing selective spectral suppression in balanced steady-state free procession (SSFP) magnetic resonance imaging for a first species and a second species is provided. A plurality of balanced SSFP images are acquired, wherein each acquisition of a balanced SSFP image comprises applying an alternating TR RF excitation, where in the alternating TR RF excitation has a first TR and a second TR, wherein a period of the first TR (TR1) is greater than a period of the second TR (TR2), applying balanced magnetic gradients, acquiring an in-phase acquisition of the first and second species, acquiring an out-of-phase acquisition of the first and second species, and combining the in-phase acquisition and the out-of-phase acquisition to produce a combined image.

In another manifestation of the invention, a computer implemented method for providing selective spectral suppression in balanced steady-state free procession (SSFP) magnetic resonance imaging for a first species and a second species is provided. A plurality of balanced SSFP images, wherein each acquisition of a balanced SSFP image comprises applying an alternating TR RF excitation, wherein the alternating TR RF excitation has a first TR and a second TR, wherein the period of the first TR (TR1) is greater than the period of the second TR (TR2), applying balanced magnetic gradients, acquiring an in-phase acquisition of the first and second species, acquiring an out-of-phase acquisition of the first and second species, and combining the in-phase acquisition and the out-of-phase acquisition to produce a combined image, comprising the N point discrete Fourier transform for each pixel in the set of images to form Fourier transformed images, applying complex weighting to said Fourier transformed images, and combining at least two of said weigthed Fourier transformed images to produce an image with selective spectral suppression.

In another manifestation of the invention n apparatus, according to a magnet system and a controller electrically connected to the magnet system. The controller comprises a display, at least one processor, and computer readable media. The computer readable media comprises computer readable code for acquiring a plurality of balanced SSFP images, wherein each acquisition of a balanced SSFP images comprise computer readable code for applying an alternating TR RF excitation, wherein the alternating TR RF excitation has a first TR and a second TR, wherein the period of the first TR (TR1) is greater than the period of the second TR (TR2), computer readable code for applying balanced magnetic gradients, computer readable code for acquiring an in-phase acquisition of the first and second species, computer readable code for acquiring an out-of-phase acquisition of the first and second species, computer readable code for combining the in-phase acquisition and the out-of-phase acquisition to produce a combined image, and computer readable code for displaying the combined image on the display.

The invention and objects and features thereof will be more readily apparent from the following detailed description and appended claims when taken with the drawings.

DETAILED DESCRIPTION OF ILLUSTRATED EMBODIMENTS

An embodiment of the invention provides a fat-water separation method comprising in-phase and out-of-phase alternating TR (ATR) SSFP images. The individual ATR SSFP spectra are flatter compared to regular balanced SSFP and the in-phase and out-of-phase profiles are nearly identical to each other. Therefore, the wide step-band created with an embodiment of the invention is practically a perfect null. The robust stop-band suppression even in the presence of high field inhomogeneity and the inherent flexibility of ATR in the selection of the repetition time allow for a wider range of fat-suppressed SSFP imaging applications.

Figure 1:
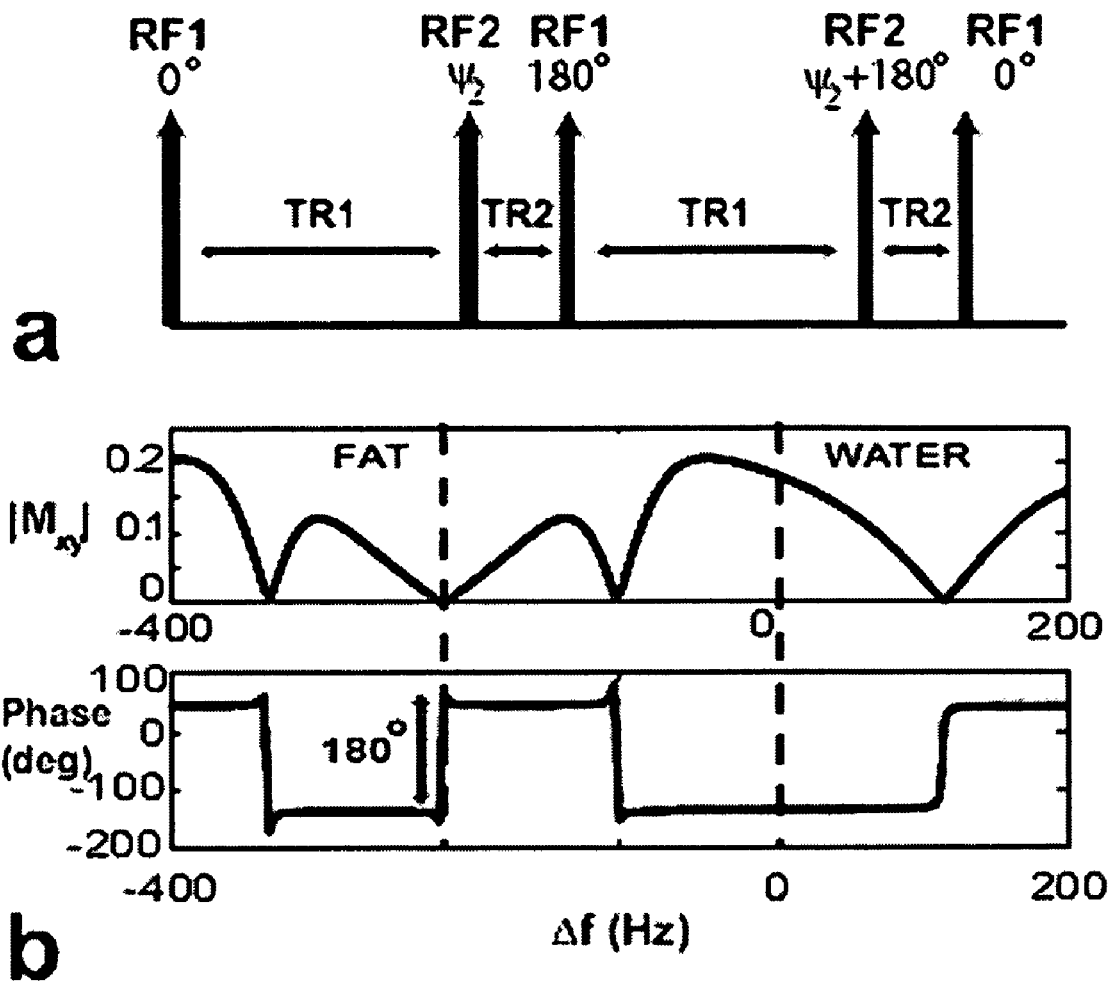
FIGS. 1a and b illustrate an alternating TR sequence.

Alternating TR SSFP uses two separate repetition times, TR1 and TR2, consecutively and in an alternating pattern. The RF pulses, RF1 and RF2, as shown in FIG. 1a, occur with the same flip angle at the beginning of periods of duration TR1 and TR2. The use of two different repetition times changes the frequency response of regular balanced SSFP and creates a dual steady state. Assuming only the TR1-period is used for acquiring data and TR2 is relatively short, the main task for this second period is changing the shape of the frequency response to create a stop-band. For this purpose an appropriate phase-cycling scheme has to be employed as displayed in FIG. 1a. The phase cycling scheme for the sequence is also shown where the phase increment from RF1 to RF2 is $\psi_2$.

The magnetization at the frequency of the stop-band null should be longitudinal during the acquisition period (TR1). The RF2 pulse with a $\psi_2$ phase tips down the magnetization, creating some transverse magnetization aligned at a $(\psi_2+90°)$ angle with the x-axis. The magnetization at the stop-band null should again be longitudinal after the RF1 pulse, applied with a 180° phase. This can be achieved if the precession at the frequency corresponding to the null aligns the transverse magnetization with the +y-axis. In other words, the sum of the transverse rotation angle due to the precession during the TR2 period and the phase of the RF2 pulse $(\psi_2)$ would be 0. The resulting relationship between the repetition times, the phase of the second RF pulse $(\psi_2)$ and the center of the stop-band $(\theta_{stop}$: the rotation angle for TR2, in degrees) are, $$\psi_2 = 360°\tau/(\tau+1), \quad (1)$$

$$\theta_{stop} = 360°/(\tau+1), \quad (2)$$

where $\tau$=TR2/TR1. Fat suppression can be achieved if the separation between the centers of the pass- and the stop-band determination by 1/(TR1+TR2) equals the frequency shift between fat and water. At 1.5 T, this corresponds to the following condition, $$TR1+TR2=4.6 \text{ ms}, \quad (3)$$

The magnetization profile for TR1=3.45 ms, TR2=1.15 ms and a corresponding (0-90-180-270)° phase cycling ($\psi_2$=90°) is shown in FIG. 1b, where TE=1.725 ms, T1/T2=1000 ms/200 ms, and $\alpha$=60°. The fat and water resonances are marked on the plot. The phase of the signal has 180° jumps across the signal nulls inherent in SSFP sequences. Furthermore, there is a null at the center of the stop-band and another at the transition from the stop-band to the pass-band. As a result, the signal for frequencies to the right of the stop-band null is out-of-phase with the pass-band signal. On the other hand, the signal for the frequencies to the left of the stop-band null is in-phase with the pass-band signal. Keeping in mind that the location of the stop-band null can be adjusted by changing $\psi_2$, the in-phase or out of-phase portions can be selectively extended.

If the stop-band null is shifted to the boundary between the pass- and stop-bands; i.e., halfway between the water and fat resonances (approximately −110 Hz at 1.5 T), by decreasing $\psi_2$, the entire band around the fat-resonance becomes in-phase with the on-resonance water signal. On the other hand, an equal amount of shift in the other direction; i.e., to −330 Hz at 1.5 T, by increasing $\psi_2$ yields a fat signal out-of-phase with the water signal. It is important to note that changing $\psi_2$ affects the shape of the stop-band profile and turns it into a relatively flat pass-band. The exact values for the phase of the second RF pulse that yield the desired signal profiles are, $$\psi_2^{i,o} = \begin{cases} 180°\tau/(1+\tau), & \text{for in-phase fat signal} \\ 540°\tau/(1+\tau), & \text{for out-phase fat signal.} \end{cases} \quad (4)$$

Figure 2:
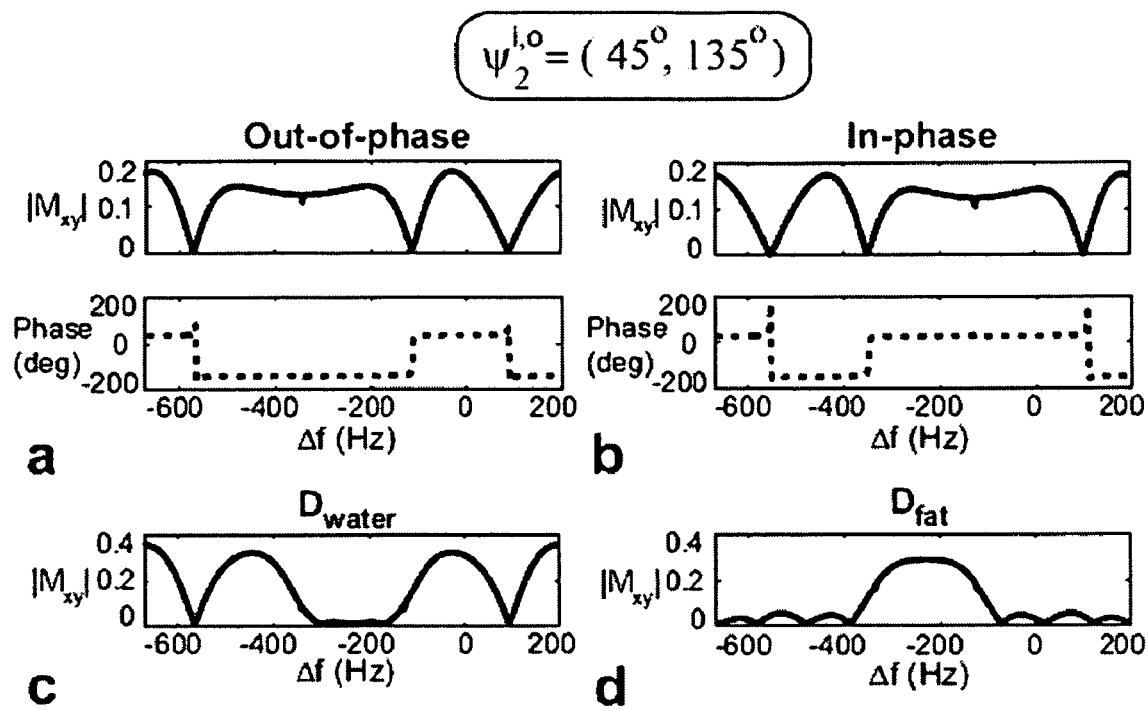
FIGS. 2a-d illustrate in-phase and out-of-phase profiles and resulting combinations.

The resulting in-phase ($\psi_2^i=45°$) and out-of-phase ($\psi_2^o=135°$) magnetization profiles for $\alpha=60°$, TR1/TR2/TE=3.45/1.15/1.725 ms and T1/T2=1000/200 ms are displayed in FIG. 2a, where $\psi_2=45°$, and FIG. 2b, where $\psi_2=135°$, for the frequency range [−400, 200] Hz. It is important to note that there is a phase difference between the pass-band signal of the different profiles. The phase difference does not depend on the flip angle and T1/T2 of the tissue. Therefore, it is a constant number for a given prescription of sequence parameters. The water-only image can be obtained by a summation of the in-phase and out-of-phase profiles after the compensation of this phase difference. Similarly, a subtraction following this phase compensation yields the fat image. The water-only spectra are shown in FIG. 2c. The fat-only sepctra are shown in FIG. 2d. The near-perfect cancellation of the fat signal is due to the flat shape of the in-phase and out-of-phase magnetization profiles over the stop-band.

From FIG. 2d, it can be observed that the fat-only profile can also be used for fat-suppression if the center of the pass-band for the fat-only spectrum is shifted to the water-resonance. This shift can be achieved by changing the phase of the second RF pulse:

$$\psi_2^{i,o} = \begin{cases} 180°\tau/(1+\tau), & \text{for in-phase fat signal,} \\ -180°\tau/(1+\tau), & \text{for out-of-phase fat signal.} \end{cases} \quad (5)$$

Figure 3:
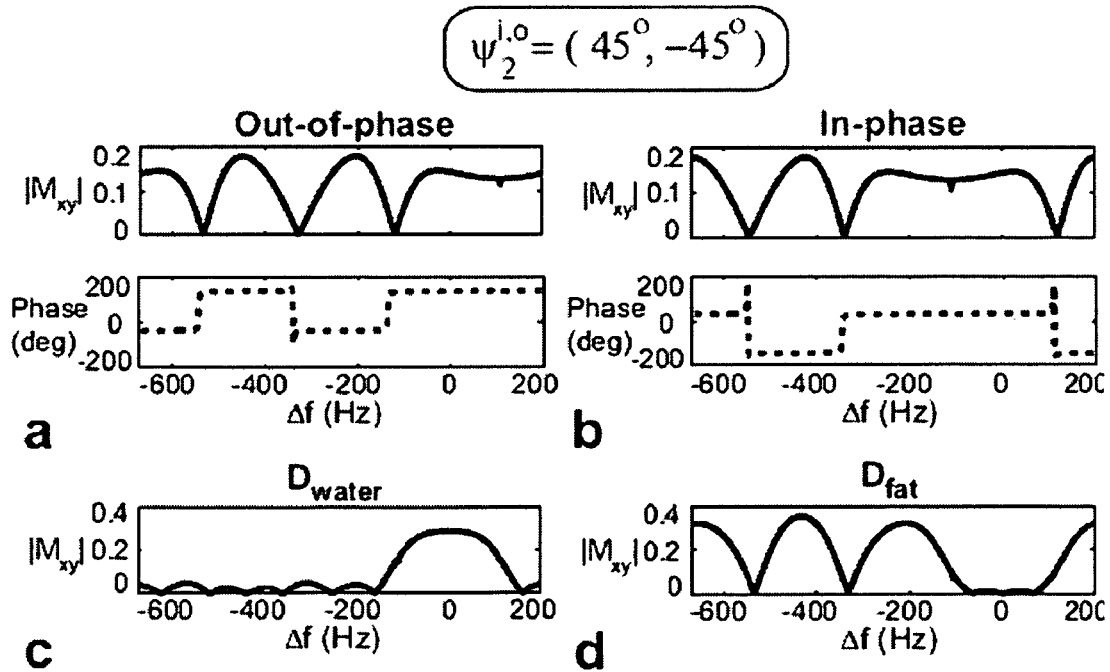
FIGS. 3a-d illustrate in-phase and out-of-phase profiles and resulting combinations.

The resulting in-phase ($\psi_2^i=45°$) and out-of-phase ($\psi_2^o=45°$) magnetization profiles for $\alpha=60°$, TR1/TR2/TE=3.45/1.15/1.725 ms and T1/T2=1000/200 ms are displayed in FIG. 3a, where $\psi_2=45°$, and FIG. 3b, where $\psi_2=45°$ for a frequency range of [−600, 200] Hz. The water-only spectra are displayed in FIG. 3c. The fat-only spectra are displayed in FIG. 3d. At the expense of slightly reduced pass-band signal, the fat-only profile has a very broad stop-band that is approximately $1/\tau$ times the width of the pass-band. The profiles are displayed in a wider range of frequencies compared to FIGS. 2a-d in order to show the increased width of the stop-band.

An embodiment of the invention offers flexibility in the selection of the parameters TR1 and TR2 as it is based on ATR-SSFP. In addition, a range of total TR (TR1+TR2) values can be prescribed while still achieving robust stop-band suppression. As the total TR is increased, the spectrum is squeezed in the frequency axis. Therefore, the widths of the stop- and pass-bands ($\alpha 1/(TR1+TR2)$) will be smaller. Both of the proposed profiles can tolerate values of (TR1+TR2) smaller than 4.6 ms, through a simple shift in the center frequency to move the center of the increased-width pass-band to higher frequencies and align the stop-band with the fat-resonance. The center of the profile (midway between the centers of the pass-and stop-bands) can be aligned with half-way between the fat- and water-resonances. The resulting frequency shift $\Delta f$, given the fat-water frequency separation $\Delta f_{fat-water}(<0)$, is:

$$\Delta f = \frac{|\Delta f_{fat-water}| - 1/(TR1+TR2)}{2}. \quad (6)$$

Equivalently the phase cycling of the RF1 pulse can be selected to yield the desired frequency shift and $\psi_2^{i,o}$ can then be readjusted to place the null in the center of the shifted stop-band. The phase increment between RF1 pulses ($\phi_1$) shifts the ATR spectrum as in regular SSFP:

$$\phi_1 = 180° - 360°(TR1+TR2)\Delta f. \quad (7)$$

However, once the phase of the RF1 pulse is changed, the condition for restoring the magnetization at the stop-band null back to the longitudinal axis between the echoes requires reevaluation to determine $\psi_2$ for FS-ATR. After an RF2 pulse with phase $\psi_2$ the magnetization precesses and just before the RF1 pulse with phase $\phi_1$, it should be aligned with the ($\phi_1-90°$) direction. This yields the following condition:

$$[(\psi_2+90°)+\theta]_{mod\,360°} = [\phi_1-90°]_{mod\,360°}, \quad (8)$$

where $\theta$ is the phase accrual due to precession at the resonant frequency corresponding to the new stop-band null over the TR2-period and is given by:

$$\theta = -360°(TR2)[\Delta f+1/(TR1+TR2)]. \quad (9)$$

The condition can be solved for $\psi_2$ as all the other variables are determined:

$$\psi_2 = 360°\tau/(1+\tau) - 360°(TR1)\Delta f, \quad (10)$$

$$360°\tau/(1+\tau) + 180°\lfloor 1+\Delta f_{fat-water}(TR1+TR2)\rfloor/(1+\tau), \quad (11)$$

The value of $\psi_2$ will be different than $360°\tau(1+\tau)$ if TR1+TR2≠4.6 ms. The additional phase term in the above equation should be added to all $\psi_2^{i,o}$ values obtained previously to achieve the desired profile.

The total TR also determines the separation between the centers of the pass-band and the stop-band in the created profiles for the $\psi_2^{i,o}=(45°, 135°)$ pair. Therefore, the maximum value of TR1+TR2 to be used with this pair is essentially limited by the stop-band width requirement for a given application. Because the stop-band is very broad for the $\psi_2^{i,o}=(45°, -45°)$ pair, the width of the pass-band becomes more constraining factor on the total TR.

The similarity between the in- and out-of-phase profiles over the fat-resonance is higher for the $\psi_2^{i,o}=(45°, 135°)$ pair. As a result, the stop-band suppression of this pair is more robust than that of the $\psi_2^{i,o}=(45°, -45°)$ pair. On the other hand, the $\psi_2^{i,o}=(45°, -45°)$ pair has a slightly broader pass-band and a very broad stop-band. Therefore, there is a trade-off between the broadness of the bands and the level of stop-band suppression, comparing the two pairs. If the stop-band width of the $\psi_2^{i,o}=(45°, 135°)$ pair is enough, it will yield better suppression. In contrast, the increased band-broadness of the latter pair can achieve robust fat-suppression in the presence of high field-inhomogeneities, at higher field strengths, or with longer TR1+TR2.

The increased frequency separation between fat and water at 3 T would suggest the use of TR1+TR2=2.3 ms for the $\psi_2^{i,o}=(45°, 135°)$ pair. If this constraint cannot be satisfied, then TR1 (3.45 ms) and TR2 (1.15 ms) can be kept the same while the frequency responses of the in- and out-of-phase profiles are shifted to align the stop-band with the fat-resonance (approximately −440 Hz at 3 T). Adding 90° to the original $\psi_2^{i,o}=(45°, 135°)$ pair—such that $\psi_2^{i,o}=(135°, 225°)$ shifts the stop-band to the desired location. The profile for the $\psi_2^{i,o}=(45°, -45°)$ pair already has a stop-band around the fat resonance; therefore, no charge in the phase cycling scheme is required.

The average remnant stop-band signal compared to the pass-band signal can serve as an appropriate measure for the effectiveness of the stop-band suppression. This measure can be used to analyze the robustness of the method to variations in tissue and scan parameters, and to allow a fair comparison between different methods. Simulations were performed to compute the ratio of the average pass-band signal (±80 Hz around the water-resonance) to the average stop-band signal (±80 Hz around the fat-resonance) for a range of flip angles, T1/T2 and TR2/TR1 ($\tau$) ratios.

Figure 4:
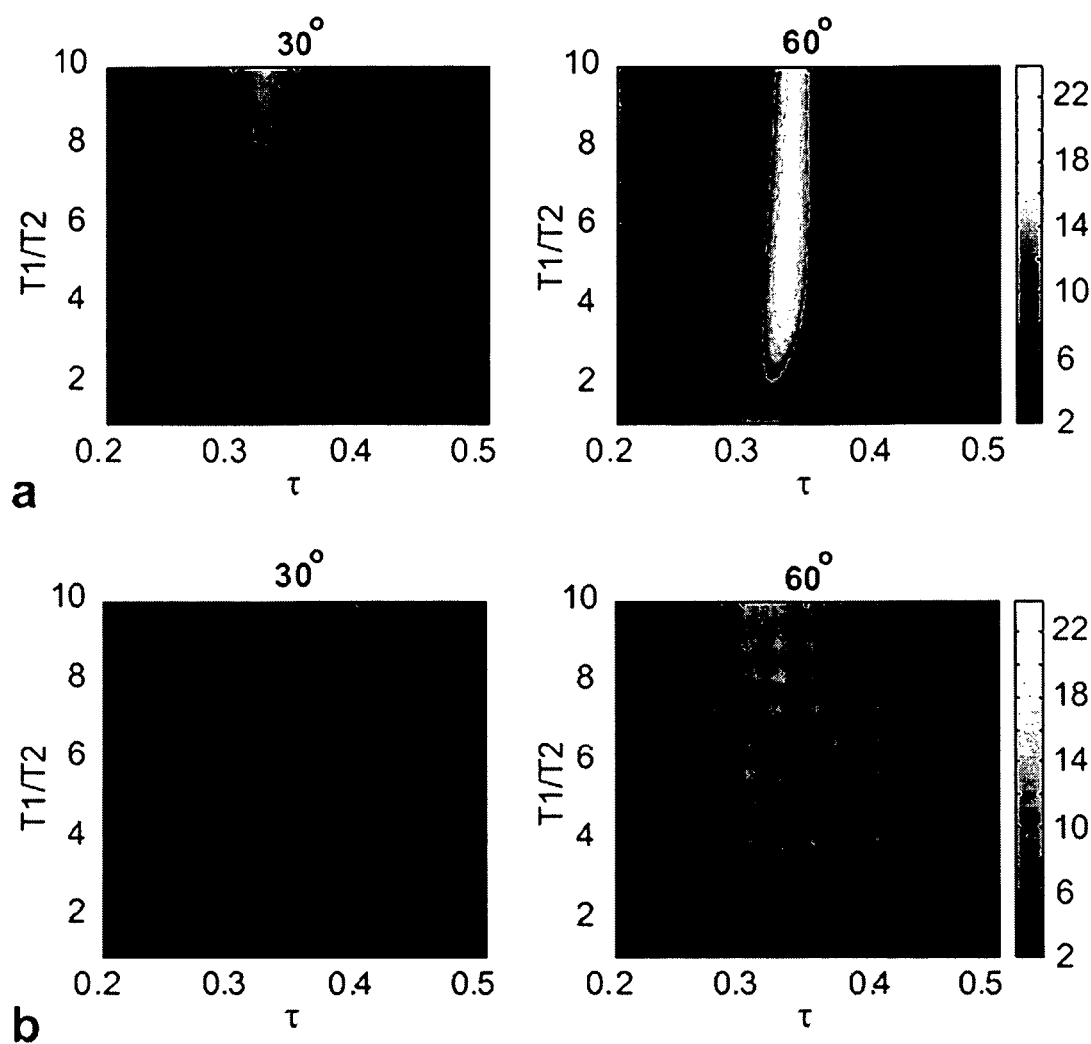
FIGS. 4a to b show ratios of average pass-band signal to average stop-band signals.
Figure 5:
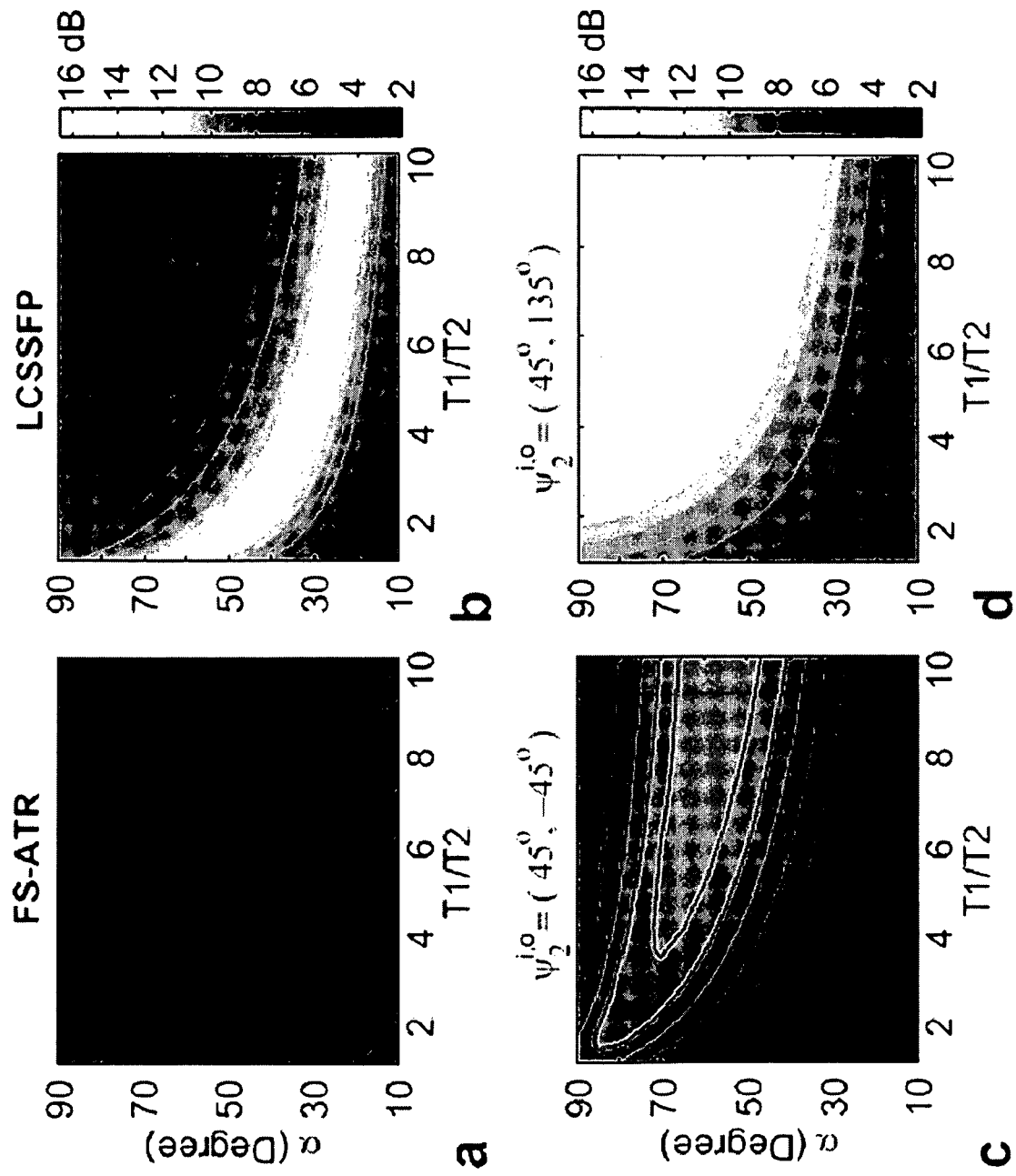
FIGS. 5a-d show ratios of average pass-band signals to average stop-band signals simulated for various suppression methods.

FIGS. 4a-b shows the contour plot of this ratio for $\alpha=30°$ and 60°, a broad range of T1/T2 ratios (1 to 10) to be found in vivo and a practically useful range of $\tau$ values (0.2 to 0.5, while satisfying the TR1+TR2=4.6 ms constraint). For the $\psi_2^{i,o}=(45°, 135°)$, shown in FIG. 4a, and $\psi_2^{i,o}=(45°, -45°)$, shown in FIG. 4b, combinations, the flatness of the in-phase and out-of-phase profiles necessary with higher flip angles. The ratio shows almost not sensitivity to the T1/T2 ratio, whereas the higher flip angle yields higher ratios. Therefore, the resulting stop-band signal suppression is better. The most robust suppression is achieved for $\tau$ within the range [0.25 0.4]. On the other hand, the sensitivity of the ratio to T1/T2 is very low. The stop-band suppression for the $\psi_2^{i,o}=(45°, -45°)$ combinations is lower; however, the increased stop-band width will yield more robust suppression with high field-inhomogeneities and at 3 T. The relatively harsh requirement of TR1+TR2=4.6 ms can be slightly violated. Since 1/(TR1+TR2) determines the distance between the centers of the pass- and stop bands, the sum of the repetition times can be increased at the expense of reducing the stop-band width.

The performance of this embodiment of the invention can be compared to other methods like FS-ATR and LCSSFP that use spectrally-shaped SSFP profiles for fat suppression. The pass-band to stop-band signal ratio for this embodiment of the invention is displayed along with that for the mentioned methods, as shown in FIGS. 5a-d. For LCSSFP, FIG. 5b, TR=2.3 ms and TE=1.15 ms were assumed. For FS-ATR, FIG. 5a, and an embodiment of the invention TR1=3.45 ms, TR2=1.15 ms and TE=1.725 ms were assumed. The ratios of the average pass-band signal to the average stop-band signal was simulated for a range of T1/T2 ratios, flip angles, and various suppression methods, which are displayed in logarithmic scale. All the methods considered were relatively insensitive to the T1/T2 ratio; however, they display a stronger flip-angle dependency. The stop-band suppression of the single-acquisitions FS-ATR method is less effective than the multiple-acquisition methods considered. As predicted by the previous simulation, the performance of the embodiment of the invention improves at higher flip angles. The sequence of $\psi_2^{i,o}=(45°, 135°)$, FIG. 5d outperforms LCSSFP, FIG. 5b, for the whole range of flip angles and tissue parameters except for a small vicinity around $\alpha=30°$. Furthermore, for optimal performance LCSSFP restricts the TR to 2.3 ms, whereas robust suppression can be achieved without stringent limitations on TR with this embodiment of the invention.

Experimental Example

Figure 6:
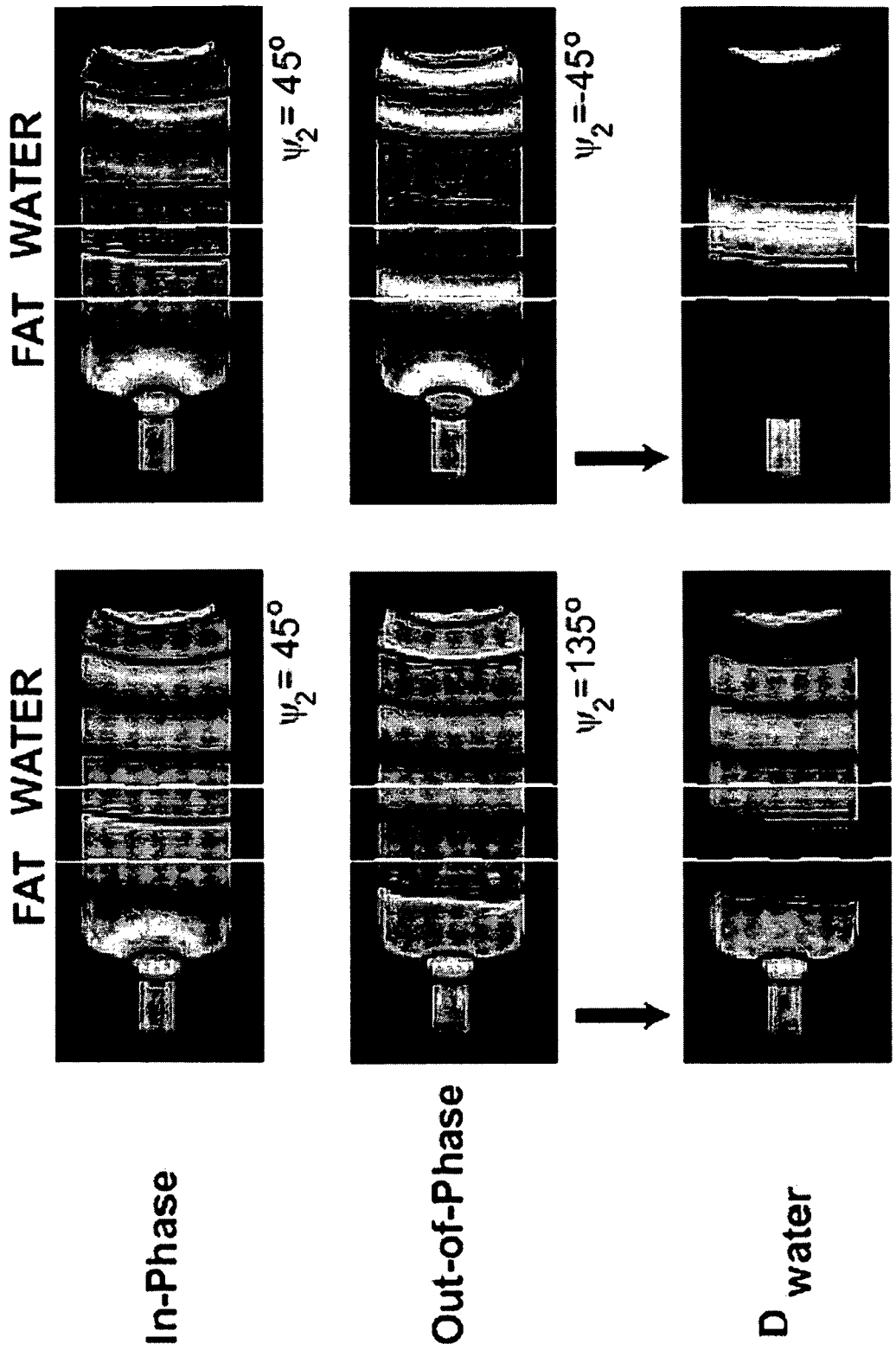
FIG. 6 shows phantom images acquired with an embodiment of the invention where off-resonance was simulated with a linear shim.

To verify this embodiment of the invention multiple-acquisition ATR fat-water separation method, 3D images of a water bottle were acquired with the following scan parameters: $\alpha=60°$, TR1/TR2/TE=3.45/1.15/1.7 ms, 2 mm isotropic resolution, ±125 kHz BW and a linear shim along the readout direction to simulate off-resonance. Two sets of in-phase and out-of-phase images, with the corresponding $\psi_2$ pairs $\psi_2^{i,o}=$ (45°, 135°) and $\psi_2^{i,o}=(45°, -45°)$, were acquired. The resulting fat- and water suppressed images for both combinations are shown in FIG. 6. The wide stop bands in the fat-suppressed images show minimal remnant signal. The $\psi_2^{i,o}=(45°, -45°)$ combination creates a broader stop-band as predicted.

Figure 7:
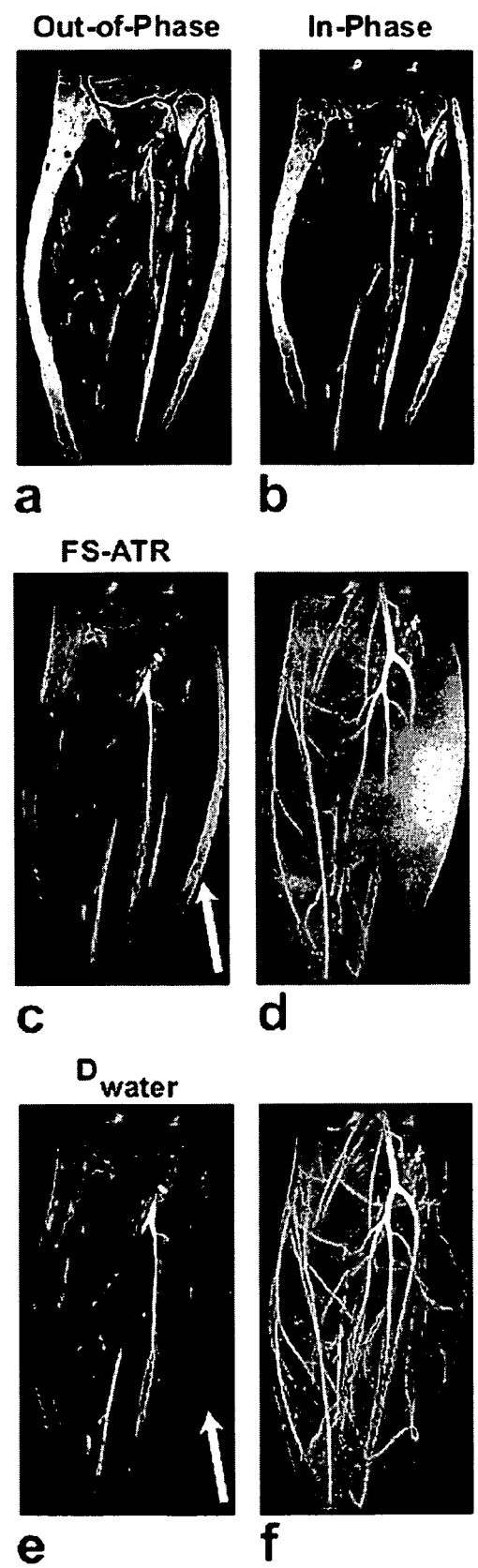
FIGS. 7a-f show coronal slices from an embodiment of the invention and a FS-ATR process.

Calf images of a volunteer were acquired with a 3D ATR SSFP sequence on a 1.5 T GE Signa Excite scanner. The only parameters changed from the phantom acquisition were a field of view (FOV) of 26 cm, an isotropic resolution of 1 mm and a total acquisition time of 2:30. FIGS. 7 a-f show the out-of-phase ($\psi_2^o=135°$) (FIG. 7a), in-phase ($\psi_2^i=45°$) (FIG. 7b) acquisitions, the water image reconstructed with an embodiment of the invention (FIG. 7e) with a corresponding maximum-intensity-projection (MIP) (FIG. 7f), and an FS-ATR image ($\psi_2=90°$) (FIG. 7c) with a corresponding maximum-intensity-projection (MIP) (FIG. 7d0. This embodiment of the invention achieves greater suppression than FS-ATR as shown by the superior vessel depiction in the resulting MIPs. There are regions with visible residual fat as a result of the remnant stop-band signal in the water images (FIG. 7.e) reconstructed with this embodiment of the invention. It is important to note that the $\psi_2^{i,o}=(45°, -45°)$ pair would not improve the level of suppression, as these regions are within the stop-band width of the $\psi_2^{i,o}=(45°, 135°)$ pair. The FS-ATR method fails to suppress the fat signals as pointed to by the arrows. Improved fat suppression of this embodiment of the invention results in superior depiction of the vasculature in the MIPs.

Figure 8:
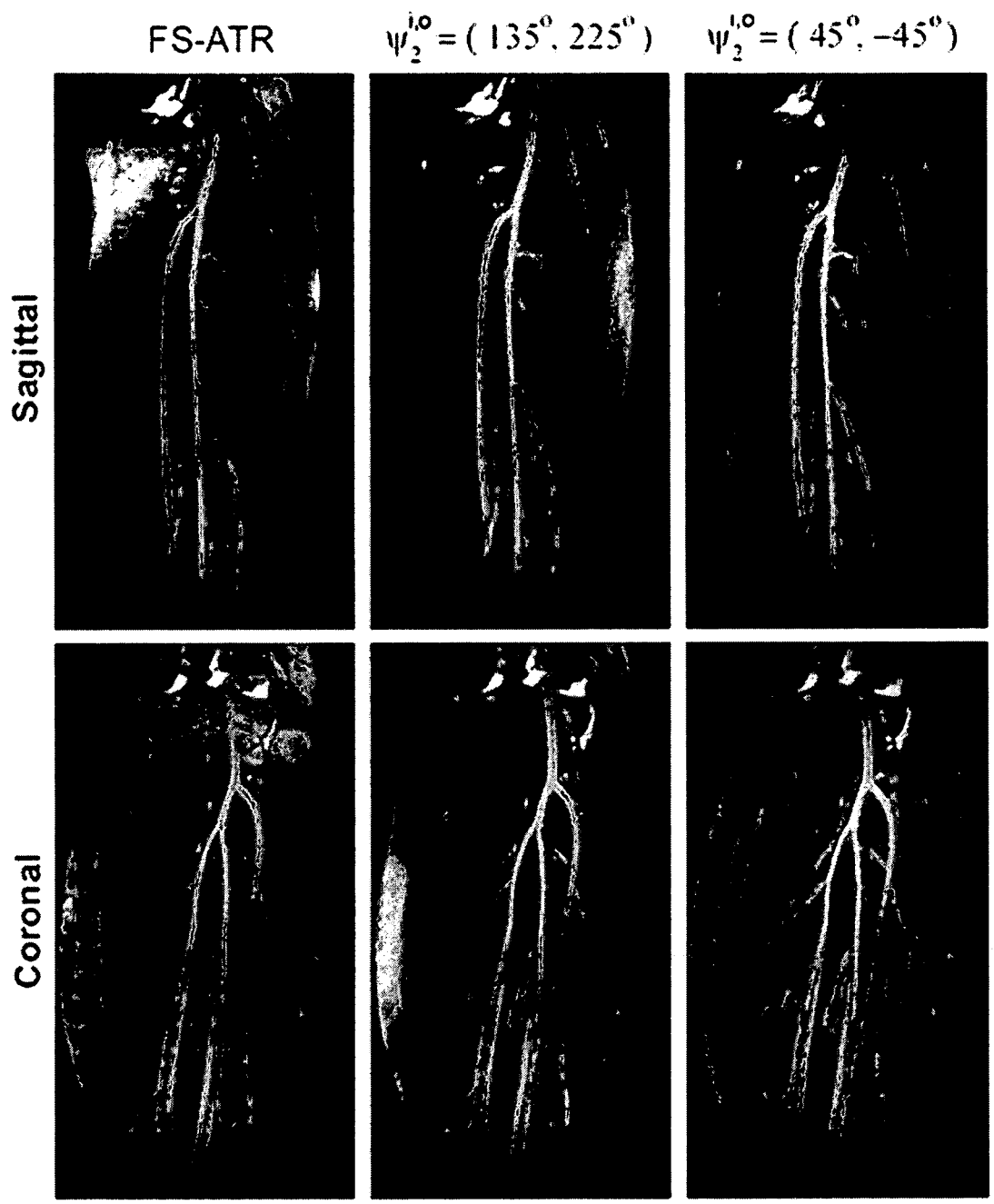
FIG. 8 shows sagittal and coronal thin slabs of calf images.

To demonstrate fat suppression at high field, calf images were acquired on a 3 T GE Signa Excite scanner. The same 3D ATR SSFP sequence prescription used for acquiring calf images at 1.5 T was used. The sagittal and coronal thin slab MIPs of the images are shown in FIG. 8 for $\psi_2^{i,o}=(135°, 225°)$, $\psi_2^{i,o}=(45°, -45°)$ and FS-ATR ($\psi_2=180°$) methods. Both multiple acquisition methods achieve better fat suppression than FS-ATR; however, the field inhomogeneity limits the performance of the $\psi_2^{i,o}=(135°, 225°)$ combination. On the other hand, the broader stop-band achievable with the $\psi_2^{i,o}=(45°, -45°)$ pair yields more robust fat suppression with minimal remnant fat signal.

Overview

An embodiment of the invention provides a multiple-acquisition fat-water separation method comprising in-phase and out-of-phase ATR SSFP images. The increased homogeneity of the in-phase and out-of-phase profiles compared to regular SSFP yields effective stop-band suppression with minimal remnant signal. This embodiment achieves the best suppression among the methods that modify the spectral response of SSFP considered in this paper. Furthermore, it does not incur the stringent limitations of FEMR and LCSSFP on TR due to the inherent flexibility of ATR on TR selection.

Acquisitions with modified spectral responses have been used for fat-water separation or fat suppression purposes in SSFP imaging. These methods do not require the disruption of the steady-state and hence are free of transient oscillation artifacts. In contrast to phase-sensitive reconstruction, partial-volume effects do not hinder the performance of these methods. A disadvantage of the spectrally selective acquisition strategies is the restriction on possible TRs. FEMR and LCSSFP are especially limiting in this sense, with a TR=2.3 ms at 1.5 T. The method proposed in Huang T Y, Chung H W, Wang F N, Ko C W, Chen C Y. Fat and water-separation in balanced steady-state free precession using the Dixon method. Magn Reson Med 2004; 51:243-247 and FS-ATR allow for a wide range of TR prescriptions. However, Huang's method has narrower stop- and pass-bands, approximately half the width of an SSFP pass-band.

The range of off-resonance frequency variation can limit the robustness of all fat suppression methods. Even though the spectrally-shaped stop-bands are usually broad, the remnant stop-band signal can be significantly in single acquisition methods like FEMR and FS-ATR. Multiple-acquisition spectrally-selective fat suppression methods, like this embodiment of the invention and LCSSFP, achieve superior stop-band suppression compared to single acquisition methods; however, the minimum scan time is lengthened. In addition, the sequential acquisition of the images in multiple-acquisition methods may increase the susceptibility to artifacts due to patient motion for relatively long scans.

Robust fat-suppressed SSFP imaging for a wide range of TR1, TR2 values and flip angles is possible with the embodiment of the invention. Increased stop-band suppression immunity to off-resonant frequency variation can be favorable for 3D imaging and in any imaging application a large field inhomogeneity is expected without the need for long and complex shimming procedures.

Figure 9:
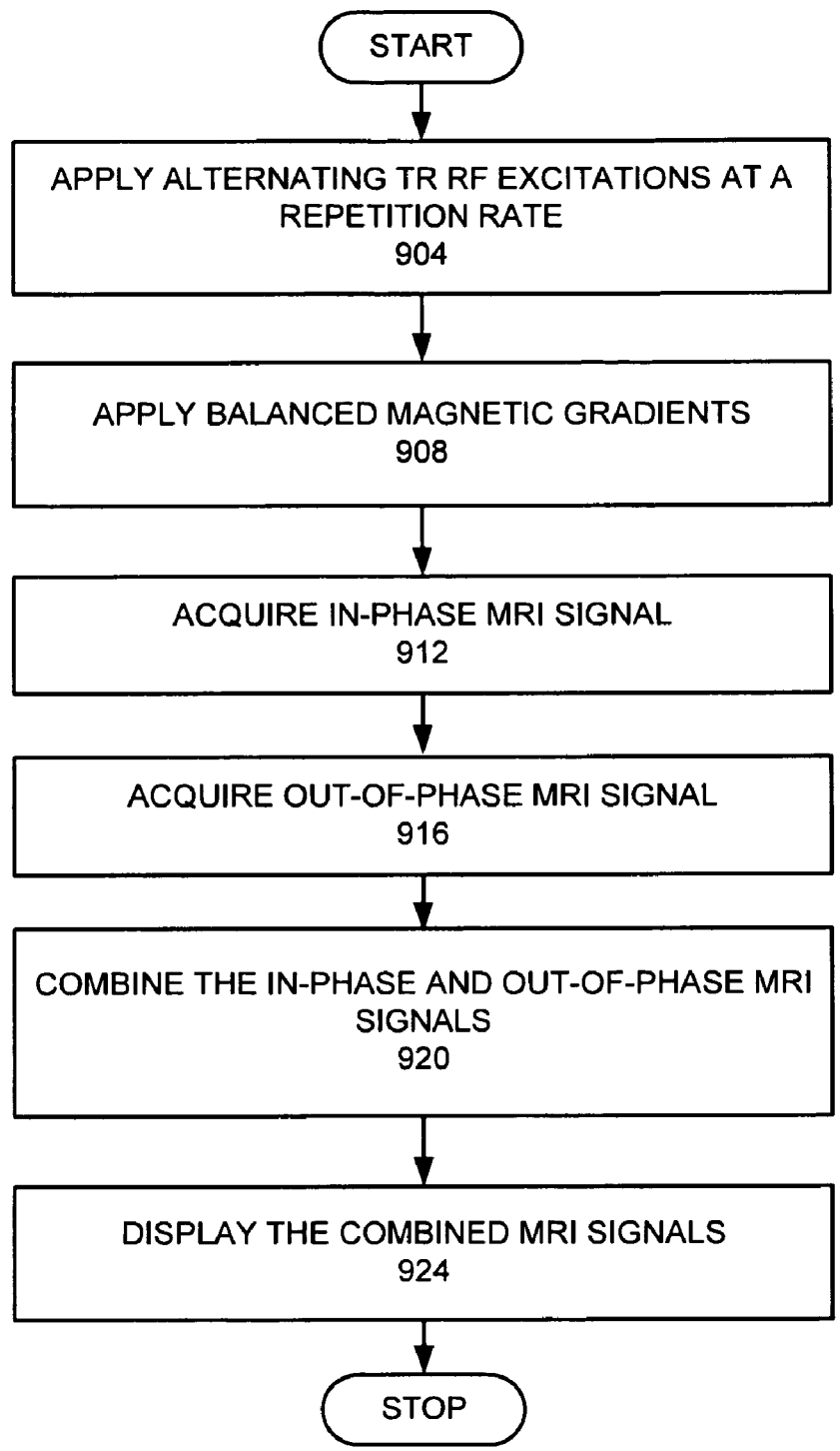
FIG. 9 is a high level flow chart of an embodiment of the invention.

FIG. 9 is a high level flow chart of an embodiment of the invention. Alternating TR RF excitation pulses are repeatedly applied at a repetition rate (step 904). Such an alternating TR RF excitation would have at least a first TR and a second TR, where the period for the first TR (TR1) is greater than the period of the second TR (TR2). Balanced magnetic gradients are applied (step 908). An in-phase MRI signal is acquired (step 912). An out-of-phase MRI signal is acquired (step 916). The in-phase and out-of-phase MRI signals are combined (step 92). The combined MRI signals are displayed (step 924).

Figure 10:
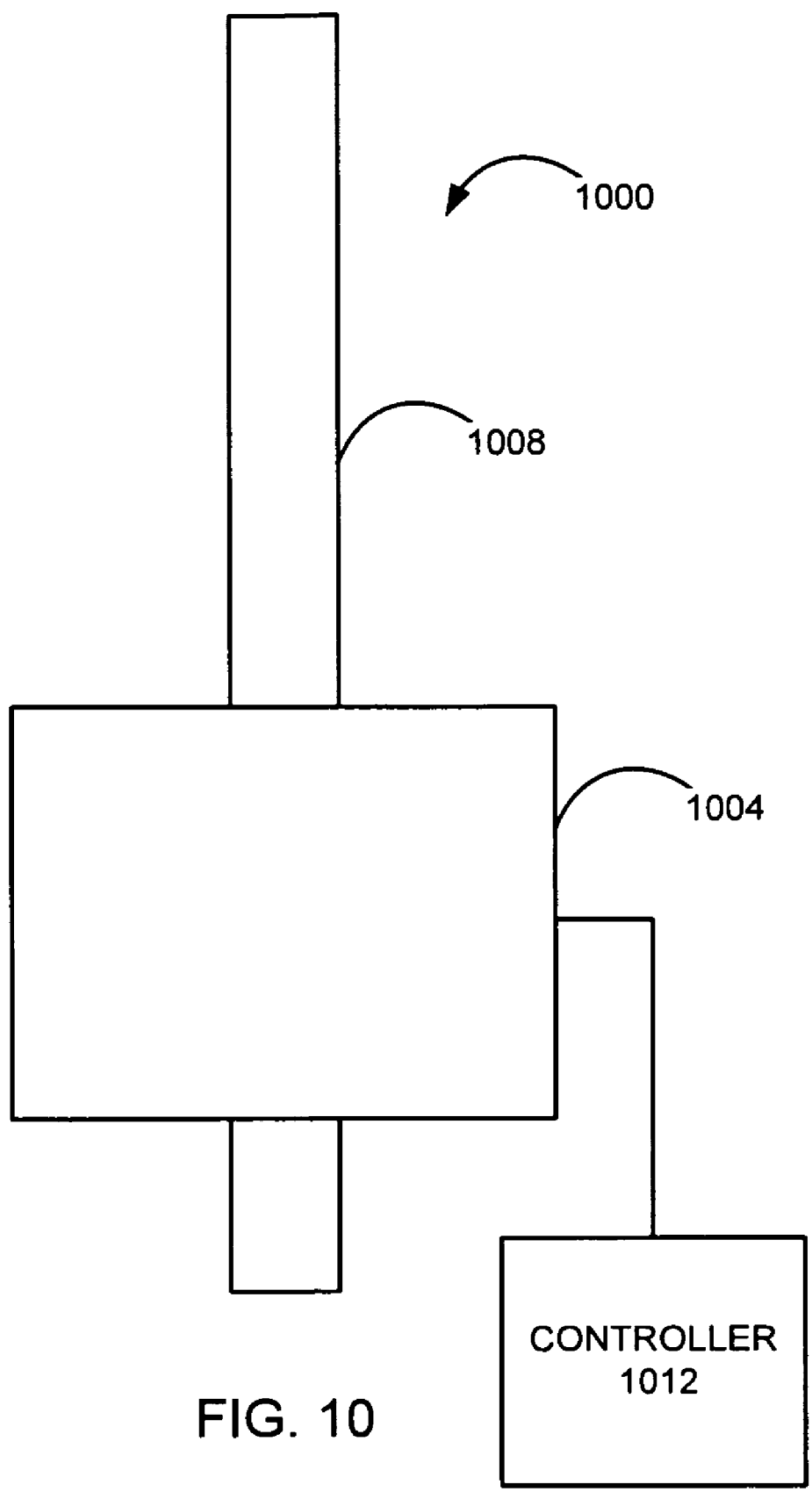
FIG. 10 is a schematic top view of a magnetic resonance imaging (MRI) system that may be used in an embodiment of the invention.

FIG. 10 is a schematic top view of a magnetic resonance imaging (MRI) system 1000 that may be used in an embodiment of the invention. The MRI system 1000 comprises a magnet system 1004, a patient transport table 1008 connected to the magnet system, and a controller 1012 controllably connected to the magnet system. In one example, a patient would lie on the patient transport table 1008 and the magnet system 1004 would pass around the patient. The controller 1012 would control magnetic fields and radio frequency (RF) signals provided by the magnet system 1004 and would receive signals from detectors in the magnet system 1004.

Figure 11A:
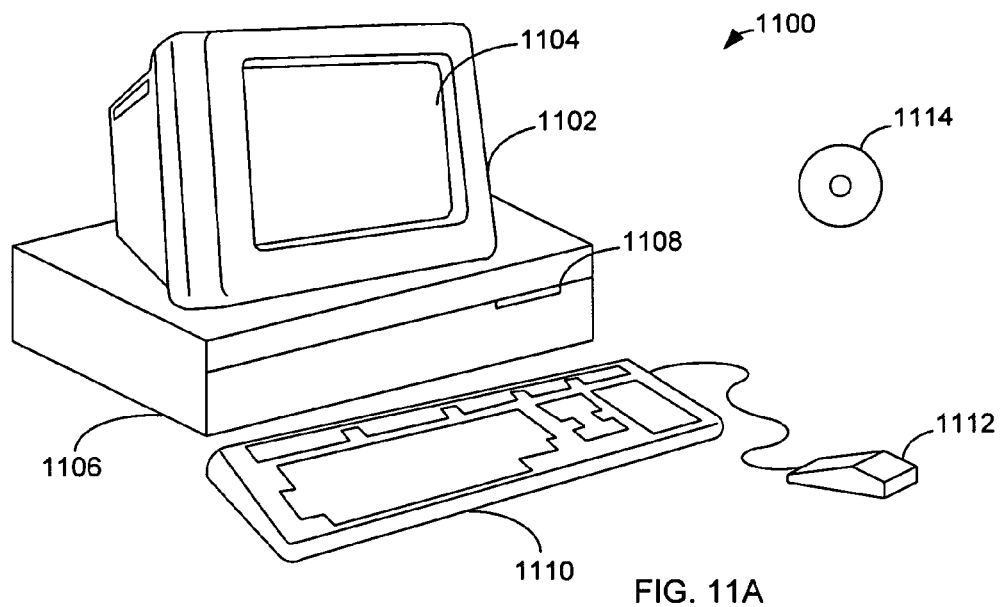
FIGS. 11A and 11B illustrate a computer system that may be used in an embodiment of the invention.
Figure 11B:
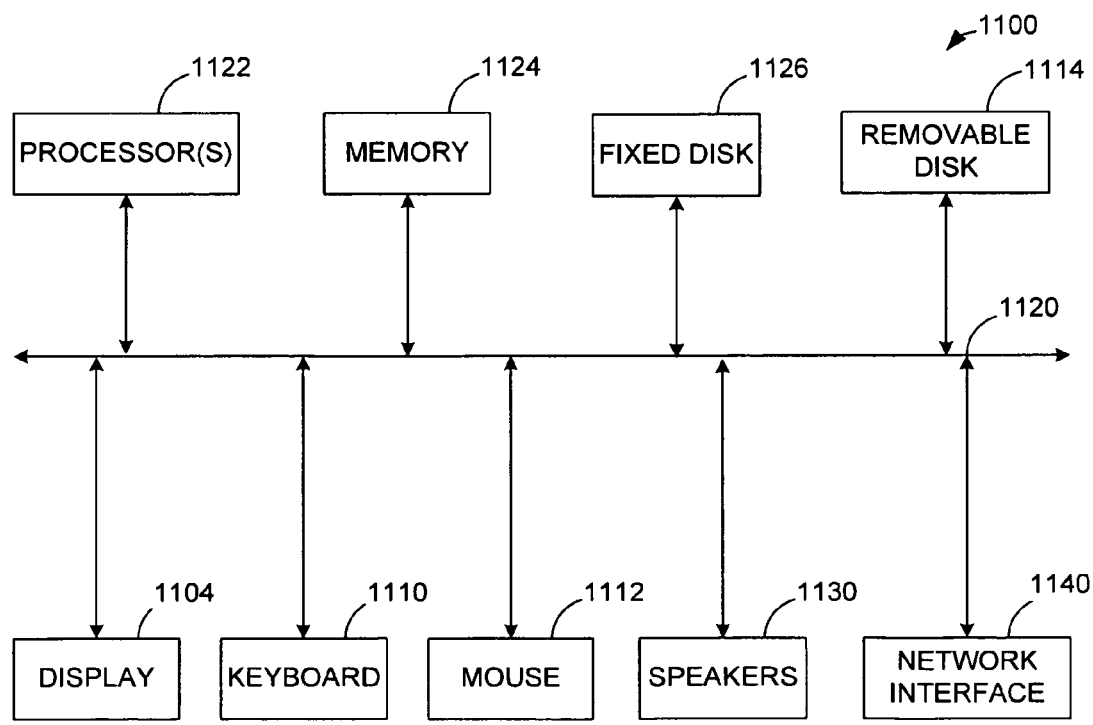

FIGS. 11A and 11B illustrate a computer system 1100, which is suitable for implementing a controller 1012 used in embodiments of the present invention. FIG. 11A shows one possible physical form of the computer system. Of course, the computer system may have many physical forms ranging from an integrated circuit, a printed circuit board, and a small handheld device up to a huge super computer. Computer system 1100 includes a monitor 1102, a display 1104, a housing 1106, a disk drive 1108, a keyboard 1110, and a mouse 1112. Disk 1114 is a computer-readable medium used to transfer data to and from computer system 1100.

FIG. 11B is an example of a block diagram for computer system 1100. Attached to system bus 1120 are a wide variety of subsystems. Processor(s) 1122 (also referred to as central processing units, or CPUs) are coupled to storage devices, including memory 1124. Memory 1124 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1126 is also coupled bi-directionally to CPU 1122; it provides additional data storage capacity and may also include any of the computer-readable media described below. Fixed disk 1126 may be used to store programs, data, and the like and is typically a secondary storage medium (such as a hard disk) that is slower than primary storage. It will be appreciated that the information retained within fixed disk 1126 may, in appropriate cases, be incorporated in standard fashion as virtual memory in memory 1124. Removable disk 1114 may take the form of the computer-readable media described below.

CPU 1122 is also coupled to a variety of input/output devices, such as display 1104, keyboard 1110, mouse 1112, and speakers 1130. In general, an input/output device may be any of: video displays, track balls, mice, keyboards, microphones, touch-sensitive displays, transducers card readers, magnetic or paper tape readers, tablets, styluses, voice or handwriting recognizers, biometrics readers, or other computers. CPU 1122 optionally may be coupled to another computer or telecommunications network using network interface 1140. With such a network interface, it is contemplated that the CPU might receive information from the network, or might output information to the network in the course of performing the above-described method steps. Furthermore, method embodiments of the present invention may execute solely upon CPU 1122 or may execute over a network such as the Internet in conjunction with a remote CPU that shares a portion of the processing.

In addition, embodiments of the present invention further relate to computer storage products with a computer-readable medium that has computer code thereon for performing various computer-integrated operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as flopped disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

For balanced processes the net area under the gradient is zero.

In an embodiment of the invention, an N point discrete Fourier transform of each pixel in the set of images is computed to form Fourier transform images. A complex weighting is applied to the Fourier transformed images. At least two of the weighted Fourier transformed images are combined to produce an image with selective spectral suppression. For example, the datasets are multiplied with a simple constant complex number (weighting), after Fourier transformation, and then the datasets are combined (here the combination is nothing but a pixel-wise addition). This combination may be considered a weighted combination rather than a simple addition, in which case they are done at the same time.

In other embodiments of the invention other species besides water and fat may be separated. In another embodiment more than two different TR RF excitation times are used, for example three alternating TR RF excitation times are used.

In other embodiments, the acquired in-phase and out-of-phase data sets are subtracted from each other over the stop-band around the fat resonance. The remnant stop-band signal is a result of the magnitude difference between the subtracted profiles. Weighting the data sets by a power of their magnitude between −1 and 0 will reduce the difference between the two magnitudes. Therefore, the stop-band suppression will be further enhanced giving the user more freedom in the selection of repetition times and flip angles.

In some embodiments, sequential acquisitions are considered. In other embodiments, two separate acquisitions can be interleaved by an appropriate RF phase cycling scheme to allow real-time acquisitions and minimize motion artifacts.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method of providing selective spectral suppression in balanced steady-state free procession (SSFP) magnetic resonance imaging for a first species and a second species, comprising:
    acquiring a plurality of balanced SSFP images, wherein each acquisition of a balanced SSFP image comprises, comprises:
    applying an alternating TR RF excitation, wherein the alternating TR RF excitation has a first TR and a second TR, wherein a period of the first TR (TR1) is greater than a period of the second TR (TR2);
    applying balanced magnetic gradients;
    acquiring an in-phase acquisition of the first and second species;
    acquiring an out-of-phase acquisition of the first and second species; and
    combining the in-phase acquisition and the out-of-phase acquisition to produce a combined image.

2. The method, as recited in claim 1, wherein the alternating TR RF excitation has a period for a spectral magnitude response that is (TR1/TR2+1)/(TR1+TR2).

3. The method, as recited in claim 2, wherein the combining comprises:
    computing the N point discrete Fourier transform for each pixel in the set of images to form Fourier transformed images;
    applying complex weighting to said Fourier transformed images; and
    combining at least two of said weighted Fourier transformed images to produce an image with selective spectral suppression.

4. The method, as recited in claim 3, wherein the in-phase acquisition has a phase $\psi_2=180°\ \tau/(1+\tau)$ and wherein the out-of-phase acquisition has a phase $\psi_2=-180°\ \tau/(1+\tau)$, wherein $\tau=TR2/TR1$.

5. The method, as recited in claim 4, wherein TR1/TR2 is an integer.

6. The method, as recited in claim 3, wherein the in-phase acquisition has a phase $\psi_2=180°\ \tau/(1+\tau)$ and wherein the out-of-phase acquisition has a phase $\psi_2=540°\ \tau/(1+\tau)$, wherein $\tau=TR2/TR1$.

7. The method, as recited in claim 6, wherein TR1/TR2 is an integer.

8. The method, as recited in claim 7, wherein the first species is water and the second species is fat.

9. The method, as recited in claim 1, wherein the combining comprises:
    computing the N point discrete Fourier transform for each pixel in the set of images to form Fourier transformed images;
    applying complex weighting to said Fourier transformed images; and
    combining at least two of said weighted Fourier transformed images to produce an image with selective spectral suppression.

10. The method, as recited in claim 1, wherein the in-phase acquisition has a phase $\psi_2=180°\ \tau/(1+\tau)$ and wherein the out-of-phase acquisition has a phase $\psi_2=180°\ \tau/(1+\tau)$, wherein $\tau=TR2/TR1$.

11. The method, as recited in claim 10, wherein TR1/TR2 is an integer.

12. The method, as recited in claim 1, wherein the in-phase acquisition has a phase $\psi_2=180°\ \tau/(1+\tau)$ and wherein the out-of-phase acquisition has a phase $\psi_2=540°\ \tau/(1+\tau)$, wherein $\tau=TR2/TR1$.

13. The method, as recited in claim 1, wherein the first species is water and the second species is fat.

14. The method, as recited in claim 1, wherein the alternating TR RF excitation further comprises a third TR with a period TR3, which is not equal to TR1 and TR2.

15. A computer implemented method for providing selective spectral suppression in balanced steady-state free procession (SSFP) magnetic resonance imaging for a first species and a second species, comprising:
    acquiring a plurality of balanced SSFP images, wherein each acquisition of a balanced SSFP image, comprises:
    applying an alternating TR RF excitation, wherein the alternating TR RF excitation has a first TR and a second TR, wherein a period of the first TR (TR1) is greater than a period of the second TR (TR2); and
    applying balanced magnetic gradients;
    acquiring an in-phase acquisition of the first and second species;
    acquiring an out-of-phase acquisition of the first and second species; and
    combining the in-phase acquisition and the out-of-phase acquisition to produce a combined image, comprising:
        computing the N point discrete Fourier transform for each pixel in the set of images to form Fourier transformed images;
        applying complex weighting to said Fourier transformed images; and
        combining at least two of said weighted Fourier transformed images to produce an image with selective spectral suppression.

16. The computer implemented method, as recited in claim 15, wherein the alternating TR RF excitation has a period for a spectral magnitude response that is (TR1/TR2+1)/(TR1+TR2).

17. An apparatus, comprising:
    a magnet system;
    a controller electrically connected to the magnet system, comprising:
        a display;

at least one processor; and computer readable media, comprising:

computer readable code for acquiring a plurality of balanced SSFP images, wherein each acquisition of a balanced SSFP image, comprising:

computer readable code for applying an alternating TR RF excitation, wherein the alternating TR RF excitation has a first TR and a second TR, wherein a period of the first TR (TR1) is greater than a period of the second TR (TR2);

computer readable code for applying balanced magnetic gradients;

computer readable code for acquiring an in-phase acquisition of the first and second species;

computer readable code for acquiring an out-of-phase acquisition of the first and second species;

computer readable code for combining the in-phase acquisition and the out-of-phase acquisition to produce a combined image; and computer readable code for displaying the combined image on the display.

18. The apparatus, as recited in claim 17, wherein the alternating TR RF excitation has a period for a spectral magnitude response that is (TR1/TR2+1)/(TR1+TR2).

* * * * *

UNITED STATES PATENT AND TRADEMARK OFFICE
CERTIFICATE OF CORRECTION

| | | |
|---|---|---|
| PATENT NO. | : 7,518,364 B1 | Page 1 of 1 |
| APPLICATION NO. | : 12/016839 | |
| DATED | : April 14, 2009 | |
| INVENTOR(S) | : Cukur et al. | |

It is certified that error appears in the above-identified patent and that said Letters Patent is hereby corrected as shown below:

Under Column 1:

• Please replace Column 1, line no. 6-11 with:

-- FEDERALLY-SPONSORED RESEARCH OR DEVELOPMENT
This invention was made with Government support under contracts HL075803 and HL039297 awarded by the National Institutes of Health. The Government has certain rights in this invention. --

Signed and Sealed this

Thirteenth Day of March, 2012

David J. Kappos
*Director of the United States Patent and Trademark Office*